United States Patent
Lacoste et al.

(10) Patent No.: US 7,911,120 B2
(45) Date of Patent: Mar. 22, 2011

(54) SOURCE FOR PROVIDING AN ELECTRON BEAM OF SETTABLE POWER

(75) Inventors: Ana Lacoste, Saint Martin Le Vinoux (FR); Jacques Pelletier, Saint Martin D'Heres (FR); Yves Alban-Marie Arnal, Poisat (FR)

(73) Assignee: Centre National de la Recherche Scientifique, Paris, Cedex (FR)

( * ) Notice: Subject to any disclaimer, the term of this patent is extended or adjusted under 35 U.S.C. 154(b) by 312 days.

(21) Appl. No.: 10/497,894

(22) PCT Filed: Dec. 6, 2002

(86) PCT No.: PCT/FR02/04223
§ 371 (c)(1),
(2), (4) Date: Nov. 18, 2004

(87) PCT Pub. No.: WO03/049139
PCT Pub. Date: Jun. 12, 2003

(65) Prior Publication Data
US 2005/0062387 A1 Mar. 24, 2005

(30) Foreign Application Priority Data
Dec. 7, 2001 (FR) .................. 01 15897

(51) Int. Cl.
*H01J 7/24* (2006.01)
(52) U.S. Cl. ............ 313/231.31; 313/362.1; 315/111.21
(58) Field of Classification Search ............ 313/231.31, 313/362.1, 231.41; 315/111.21–111.91
See application file for complete search history.

(56) References Cited

U.S. PATENT DOCUMENTS

| 3,831,052 A | 8/1974 | Knechtili .................. 313/187 |
| 4,684,848 A | 8/1987 | Kaufman et al. ........ 315/111.81 |

FOREIGN PATENT DOCUMENTS

| DE | 19821802 A1 | 12/1999 |
| FR | 2583250 A1 | 12/1986 |
| FR | 2702119 A1 | 4/1994 |
| FR | 2726729 A1 | 5/1996 |
| FR | 2733300 A1 | 10/1996 |
| FR | 2797372 A1 | 2/2001 |
| FR | 2817392 | 5/2002 |

OTHER PUBLICATIONS

Sugai H. et al.: "Generation of a Large Electron Beam for Plasma Processing", Japanese Journal of Applied Physics, Publication Office of Japanese Journal of Applied Physics, Tokyo, JP, vol. 28, No. 5, part 2, May 1, 1989, pp. L868-L870.
Tanaka S. et al.: "Design and Experimental Results of a New Electron Gun Using a Magnetic Multipole Plasma Generator", Review of Scientific Instruments, American Institute of Physics, New York, US, vol. 62, No. 3, Mar. 1, 1991, pp. 761-771.
Part 5.5.2 "Electron beam characteristics of minaturized ECR plasma cathodes" of work "Electron Cyclotron Resonance Ion Sources and ECR Plasmas" by R. Geller, published by the Institute of Physics Publishing Bristol and Philadelphia (pp. 352-353); Jul. 25, 1997.

*Primary Examiner* — Joseph L Williams
(74) *Attorney, Agent, or Firm* — Duane Morris LLP

(57) ABSTRACT

The invention concerns a source supplying an adjustable energy electron beam, comprising a plasma chamber (P) consisting of an enclosure (1) having an inner surface of a first value ($S_1$) and an extraction gate (2) having a surface of a second value ($S_2$), the gate potential being different from that of the enclosure and adjustable. The invention is characterized in that the plasma is excited and confined in multipolar or multidipolar magnetic structures, the ratio of the second value ($S_2$) over the first value ($S_1$) being close to: $D=1/\beta \sqrt{2\pi m_e/m_i} \exp(-½)$, wherein: $\beta$ is the proportion of electrons of the plasma P, $m_e$ the electron mass, and $m_i$ is the mass of positively charged ions.

8 Claims, 2 Drawing Sheets

SOURCE FOR PROVIDING AN ELECTRON BEAM OF SETTABLE POWER

RELATED APPLICATIONS

This application is a National Stage of International Application No. PCT/FR02/04223, filed on Dec. 6, 2002, which claims priority of French Application No. 01/15897 filed on Dec. 7, 2001.

FIELD OF THE INVENTION

The present invention relates to the field of electron sources. More specifically, the present invention relates to the forming of extended electron beams intended to be injected into a plasma, under vacuum, or in any reactive gaseous atmosphere at reduced pressure.

BACKGROUND OF THE INVENTION

On manufacturing of circuits in semiconductor devices, certain deposition or etch steps performed in ionized gases use electron sources. Indeed, it may for example appear to be necessary to negatively bias the surface of a substrate by bombarding it with an electron beam. An electron source may further be necessary to generate a plasma, to increase the ionization rate of a plasma, or yet to accelerate the ions of a plasma in which a substrate is placed. Further, different electron beam powers are desired to be used according to the considered application. For example, it may be necessary to have an electron beam with a power on the order of 100 eV to enable erosion (etch) of a substrate.

Electron sources of point type such as a heated emissive cathode are already available. However, such sources have the disadvantage of providing beams with a very small cross-section. The maximum possible processing surface area is thus very limited. Further, such sources can seldom be used in the considered applications, since the involved gases (plasma) risk reacting with the electrode.

Part 5.5.2 "Electron beam characteristics of miniaturized ECR plasma cathodes" of work "Electron Cyclotron Resonance Ion Sources and ECR Plasmas" by R. Geller, published by the Institute of Physics Publishing Bristol and Philadelphia (pages 352-353) describes electron sources in which electrons are extracted from a plasma. However, such sources cannot be sources of large surface area. Indeed, to be able to increase the electron extraction surface area of a plasma, the plasma volume has to be increased. Then, obtaining the electromagnetic field necessary to excite the plasma at the cyclotron resonance imposes generation of a continuous axial magnetic field of excessively high intensity. The generation of such a magnetic field, intended to confine the trajectory of the extracted electrons around the magnetic field lines imposes using particularly complex, bulky, and expensive installations. Further, the presence of a continuous axial magnetic field may be a problem in certain applications. This limits the extraction surface area to a few square millimeters. Further, electron sources of this type generate electron beams of an intensity limited to the order of one hundred milliamperes. Further, the current density exhibits an exponential-type variation along with the beam extraction power. It is thus impossible to extract on an extended surface area an electron beam of a current density which remains relatively steady when the beam extraction potential is modified. Further, said potential is at most on the order of some hundred volts.

The present invention aims at providing an electron source which exhibits at least some of the following features:

usable for different application fields,
capable of providing a beam, with as high as possible an electron current density,
relatively steady when the beam power is varied,
beam power controllable within a wide range,
surface area as extended as possible, for example, with a diameter from a few centimeters to a few tens of centimeters, or more,
free of the problems of known sources, and especially, exhibiting no axial magnetic field at the level or downstream of the extraction.

SUMMARY

To achieve these objects, the present invention provides a source providing an electron beam of settable power, comprising a plasma chamber formed of an enclosure having an internal surface area of a first value and of an extraction grid having a surface area of a second value, the grid potential being different from that of the enclosure and being settable, characterized in that the plasma is excited and confined in multipolar or multidipolar magnetic structures, the ratio of the second value to the first value being close to the following upper limit:

$$D = \frac{1}{\beta}\sqrt{\frac{2\pi m_e}{m_i}} \exp(-1/2),$$

where:
  β is the electron ratio of plasma P,
  $m_e$ is the mass of the electron, and
  $m_i$ is the mass of the positively-charged ions,
whereby the electron current density of the extracted beam is substantially steady when the grid-enclosure potential difference varies.

According to an embodiment of the present invention, the plasma is excited and confined by microwaves at the distributed electronic cyclotron resonance.

According to an embodiment of the present invention, the ratio between the second value and the first value is selected to be between D/10 and D.

According to an embodiment of the present invention, the ratio between the second value and the first value is selected to be between D/2 and D.

According to an embodiment of the present invention, the grid is divided into a plurality of elementary grid portions.

According to an embodiment of the present invention, various grid portions are gathered and set to distinct potentials.

According to an embodiment of the present invention, the source is followed by a post-acceleration enclosure.

According to an embodiment of the present invention, the gate is formed of parallel tubes run through by a cooling fluid.

BRIEF DESCRIPTION OF THE DRAWINGS

The foregoing objects, features, and advantages of the present invention will be discussed in detail in the following non-limiting description of specific embodiments in connection with the accompanying drawings, among which.

DETAILED DESCRIPTION

According to the present invention, a plasma chamber using excitation and confinement structures using multipolar or multidipolar magnetic structures at the distributed electron cyclotron resonance such as described, for example, in French patent applications No 85/08836, 93/02414, 94/13499, and 99/10291, is used as an electron source.

Such low-pressure plasma excitation devices advantageously enable increasing the surface area of extraction of an electron beam without imposing large magnetic field volumes, and while avoiding the presence of a magnetic field at the level and downstream of the extraction.

Figure 1:
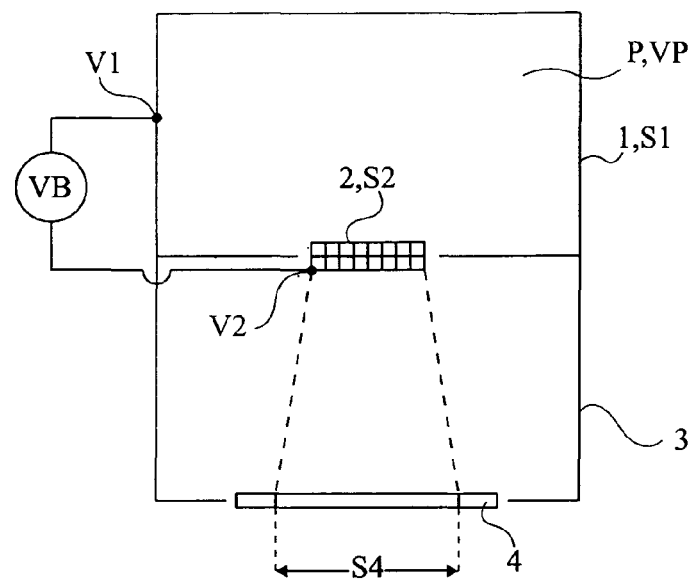
FIG. 1 schematically illustrates a charged particle extraction plasma chamber.

FIG. 1 schematically and partially illustrates a specific embodiment of the present invention. A confinement chamber of a plasma P is formed of an enclosure 1 with an internal surface area $S_1$ and of an extraction grid 2 of surface area $S_2$. Grid 2, isolated from enclosure 1, is biased by a voltage $V_B$ to potential $V_2$ with respect to this enclosure. Voltage $V_B$ is settable by a used. Electrons are desired to be extracted from plasma P. Potential $V_2$ of grid 2 must be greater than potential $V_1$ of enclosure 1, that is, voltage $V_B$ is positive ($V_B=(V_2-V_1)>0$). The multipolar or multidipolar magnetic excitation structures are not shown in FIG. 1. These will be, for example, structures similar to those described in the above-mentioned French patent applications.

The electron beam thus generated penetrates through grid 2 into an enclosure 3 of confinement of a processing atmosphere (gas, ionized gas, or plasma) of an element to be processed 4, such as a semiconductor substrate. The beam coming from grid 2 penetrates into enclosure 3 and enables processing and/or negatively biasing a surface $S_4$ of substrate 4.

Figure 2:
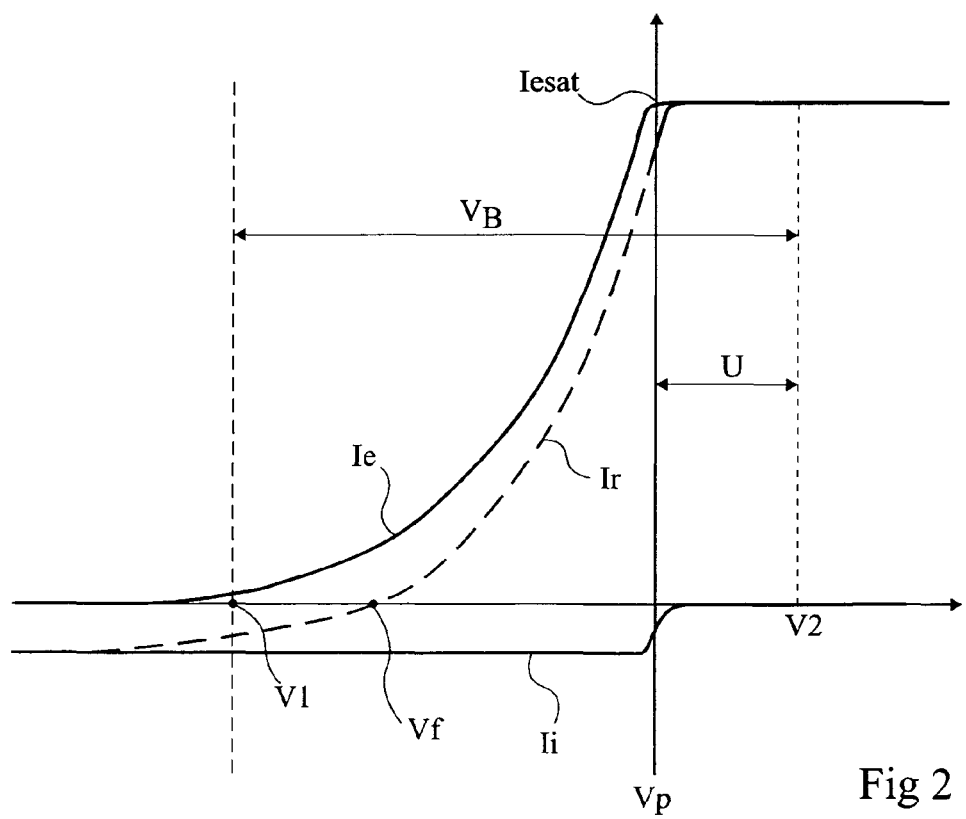
FIG. 2 illustrates the electronic and ionic currents at the level of a surface of a chamber according to FIG. 1.

FIG. 2 illustrates the theoretical variation of the currents corresponding to the particles extracted from plasma P according to the value of extraction voltage $V_B$. An electron current $I_e$ is considered as being positive and a positive ion current $I_i$ is considered as being negative. More specifically, it is known, for example from French patent application No 95/04729 issued to the CNRS, that the electron current $I_e$ and the positive ion current $I_i$ that can be extracted from plasma P depend on difference $U=V_B-V_P$, where $V_P$ is the potential of plasma P. When U is negative and ranges between $V_f$ and zero, electron current $I_e$ increases according to an exponential law to a maximum saturation value $I_{esat}$. When U is positive, that is, when bias potential $V_B$ exceeds the potential of plasma $V_P$, the extracted electron current remains constant at maximum saturation voltage $I_{esat}$. However, the extracted positive ion current $I_i$ remains substantially constant as long as U is negative. When U is positive, ion current $I_i$ becomes zero. FIG. 2 also illustrates in dotted lines real current $I_r$, that is, the algebraic sum of electron and positive ion currents $I_e$ and $I_i$. The value of U for which electron current $I_e$ is equal to positive ion current $I_i$, that is, for which real current $I_r$ is zero, is called the floating potential $V_f$.

A priori, to obtain a source such as defined hereabove, it should be enough to apply a voltage $V_B$ sufficiently high to be in the saturation field, to the right of the curve of FIG. 2. In practice, account must be taken of an adjustment with respect to one another of potential $V_P$ of plasma P and of potentials $V_1$ of enclosure 1 and $V_2$ of grid 2. Indeed, such a self-adjustment enables guaranteeing at any time the neutrality of plasma P. To keep the neutrality principle, the positive ion current on all electrode surfaces must at any time exactly compensate for the electron current on these surfaces.

To reach saturation $I_{esat}$ on grid 2, the characteristic of FIG. 2 shows that the adjustment must be performed so that potential $V_2$ of grid 2 is greater than potential $V_P$. Similarly, to respect the neutrality principle, that is, so that surface area $S_1$ of enclosure 1 can absorb the ion current compensating for this saturation current $I_{esat}$, potential $V_1$ of enclosure 1 must be smaller than potential $V_f$. Surface area $S_1$ then receives both an ionic saturation current and an electronic current, as illustrated in FIG. 2.

In steady state, the saturation electronic current towards grid 2 is given by the following relation:

$$I_2 = I_{esat} = -e\beta n S_2 \sqrt{\frac{k_B T_e}{2\pi m_e}},$$

where:
 $-e$ is the electronic charge,
 $\beta$ is the electron ratio of plasma P,
 n the ion density of plasma P,
 $S_2$ the surface area of grid 2,
 $k_B$ is Boltzmann's constant,
 $T_e$ is the electron temperature in the beam, and
 $m_e$ is the mass of the electron.

The current collected by enclosure 1 is the sum of a positive ionic saturation current and of an electronic current and can be expressed as follows:

$$I_1 = en S_1 \sqrt{\frac{k_B T_e}{m_i}} \exp(-1/2) - e\beta n S_1 \sqrt{\frac{k_B T_e}{2\pi m_e}} \exp\left[\frac{e(V_1 - V_P)}{k_B T_e}\right],$$

where $m_i$ is the mass of the positively-charged ions.

Then, to respect to plasma neutrality condition, there must be $I_1+I_2=0$, which results in the following relation:

$$V_P - V_1 = -\frac{k_B T_e}{e} \ln\left[\frac{1}{\beta}\sqrt{\frac{2\pi m_e}{m_i}} \exp(-1/2) - \frac{S_2}{S_1}\right].$$

Further, the automatic adjustment of the potentials must be performed so that this difference is positive. The surface area ratio must thus be such that:

$$\frac{S_2}{S_1} < \frac{1}{\beta}\sqrt{\frac{2\pi m_e}{m_i}} \exp(-1/2).$$

To simplify the rest of the discussion, the optimal limit thus defined will be called D, that is:

$$D = \frac{1}{\beta}\sqrt{\frac{2\pi m_e}{m_i}} \exp(-1/2) \cong \frac{1.5}{\beta}\sqrt{\frac{m_e}{m_i}}$$

This condition being fulfilled, surface area $S_1$ takes a potential $V_1$ close to floating potential $V_f$, potential $V_2$ of surface area $S_2$ takes a positive value with respect to plasma potential $V_P$ and receives an electronic current density equal to the electronic saturation current density. The power of the electrons in the beam output by grid 2 then is on the order of extraction power $eV_B$, assuming that the thermal power of the electrons $k_B T_e$ is negligible as compared to $V_B$. The beam power thus only depends on the potential difference $V_B$ applied by the user between grid 2 and enclosure 1.

If the upper limit thus defined is exceeded, the obtained source exhibits an extended surface area, but the density of the electronic current of the extracted beam is no longer substantially steady with respect to the extraction power and varies exponentially with the extraction power.

According to the present invention, it is however possible to obtain a beam with an extended cross-section of substantially constant intensity ($I_{esat}$) and of controlled variable power ($eV_B$). More specifically, it is possible to vary at the output of the extraction chamber the electron power within a range from a few eV to a few hundreds of eV, instead of some ten eV with prior devices. This result is obtained without modifying the level of the extracted electronic current. Said current depends on the plasma density and may reach current densities of from a few tens to a few hundreds of mA/cm².

According to the present invention, the current is substantially steady, that is, its variation according to extraction voltage U does not have an exponential character (of type $e^U$), but is of type $U^\alpha$, with $\alpha < \frac{1}{2}$, for example according to a $\sqrt{U}$ law.

According to the present invention, it is also possible to optimize extraction surface area $S_2$. Surface area $S_2$ is chosen so that ratio $S_2/S_1$ of the extraction surface area to the internal surface area of enclosure 1 of the chamber is smaller than limit D, but as close as possible thereto.

Figure 3:
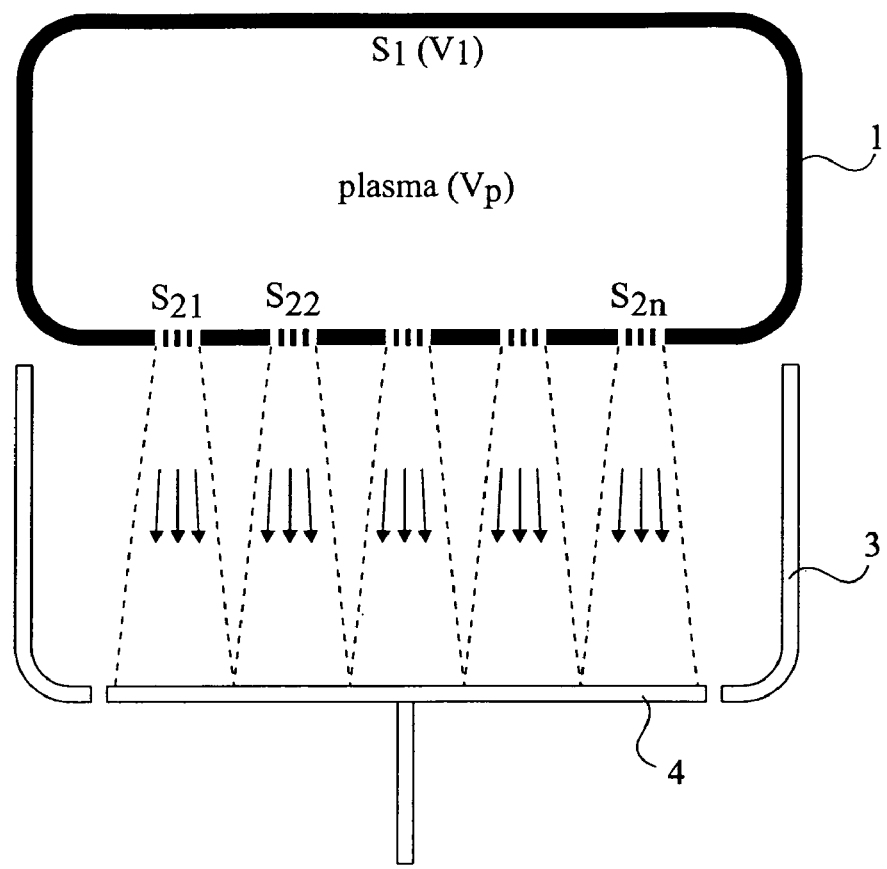
FIG. 3 schematically illustrates an alternative electron source according to the present invention.

To increase the surface area $S_4$ that can be processed, the grid may be split as illustrated in FIG. 3, the sum of surface areas $S_{21}, S_{22}, \ldots, S_{2n}$ of the grid portions corresponding to above-mentioned surface area $S_2$. Indeed, by a beam dispersion effect, the processed surface area is greater than the extraction surface area. The openings are formed close to one another so that the beams partially cover one another at the level of element 4 as they scatter, so that surface area $S_4$ is continuously bombarded. All the grid portions can be biased to a same voltage $V_B$. It may also be chosen to gather the grid portions into assemblies biased to distinct voltages.

Another advantage of this splitting of extraction surface area $S_2$ is to guarantee a better cooling down thereof. Indeed, if an electron current with a relatively high density $I_{esat}$ is desired to be extracted, a relatively high thermal power generation can be observed at the grid level. Now, it is easier to cool down a plurality of elementary grids than a continuous extraction grid, especially because the surface separating two elementary grids can be used as a radiator or cooled down by the flowing of a fluid. It is thus possible according to the present invention to ensure an efficient cooling down even for relatively high extraction powers while guaranteeing an extended extraction surface area. For the extraction from plasmas of very high densities, a direct cooling down of the grid will have to be provided, by forming it by means of a bundle of parallel tubes of a diameter on the order of one mm spaced apart by a distance on the order of one mm.

As a non-limiting example, if the plasma is an argon plasma having atomic number 40, $\beta=1$ and ratio $S_2/S_1$ must be smaller than $D=1.5/(1836.40)^{1/2}$, that is, 1/180. In a practical example, the good operation of the system in the specific case where the extraction grid had a 4-cm diameter and where the plasma chamber was a cylinder with a 20-cm height and a 25-cm diameter has been confirmed. In this case, $S_2=12.5$ cm² and $S_1=2550$ cm², ratio $S_2/S_1$ thus is 1/204, which fulfills the required condition. The electron current that could be extracted from the plasma was practically 0.5 ampere under an extraction voltage $V_2-V_1$ of 60 V.

Of course, the present invention is likely to have various alterations, modifications, and improvements which will readily occur to those skilled in the art. In particular, the plasma may be formed from gases other than argon, for example, lighter gases such as hydrogen or helium.

Further, it will be within the abilities of those skilled in the art to complete the electron source illustrated in FIG. 1 with the appropriate devices necessary to its operation, described for example in French patent application No 99/10291. Similarly, processing enclosure 3 may be completed in any appropriate fashion. A post-acceleration grid or electrode may for example be provided between extraction grid 2 of the electron source and processing enclosure 3.

The invention claimed is:

1. A source for providing an electron beam of settable power, the source comprising:
 a plasma chamber including an enclosure having an internal surface area of a first value and an extraction grid having a surface area of a second value, the grid having a potential that is different from a potential of the enclosure and being settable; and
 multipolar or multipolar magnetic structures for exciting and confining a plasma,
 wherein a ratio of the second value to the first value is selected to be between an upper limit D and D/2, where D is equal to:

$$\frac{1}{\beta}\sqrt{\frac{2\pi m_e}{m_i}}\exp(-1/2)$$

where $\beta$ is an electron ratio of the plasma, $m_e$ is a mass of an electron, and $m_i$ is a mass of positively-charged ions, and
 wherein an electron current density of an extracted beam is substantially steady when a grid-enclosure potential difference varies.

2. The source of claim 1, wherein the plasma is excited and confined by microwaves at an distributed electron cyclotron resonance.

3. The source of claim 1, wherein the ratio between the second value and the first value is selected to be between D/10 and D.

4. The source of claim 1, wherein the grid is divided into a plurality of elementary grid portions.

5. The source of claim 4, wherein various grid portions are gathered and set to distinct potentials.

6. The source of claim 4, further comprising gate formed of parallel tubes running through a cooling fluid for cooling the grid.

7. The source of claim 1, further comprising a post-acceleration grid or electrode between the extraction grid and the enclosure.

8. The source of claim 1, further comprising gate formed of parallel tubes running through a cooling fluid for cooling the grid.

* * * * *